(12) United States Patent
Anderson et al.

(10) Patent No.: US 12,682,977 B2
(45) Date of Patent: Jul. 14, 2026

(54) MEMORY LIFECYCLE STATE SENSORS

(71) Applicant: XILINX, INC., San Jose, CA (US)

(72) Inventors: James Anderson, Madison, AL (US); Jason J. Moore, Albuquerque, NM (US); James D. Wesselkamper, Albuquerque, NM (US); Roger D. Flateau, Jr., San Jose, CA (US)

(73) Assignee: XILINX, INC., San Jose, CA (US)

( * ) Notice: Subject to any disclaimer, the term of this patent is extended or adjusted under 35 U.S.C. 154(b) by 94 days.

(21) Appl. No.: 18/608,355

(22) Filed: Mar. 18, 2024

(65) Prior Publication Data

US 2025/0292856 A1     Sep. 18, 2025

(51) Int. Cl.
*G11C 29/38* (2006.01)
*G11C 29/12* (2006.01)
(52) U.S. Cl.
CPC .......... *G11C 29/38* (2013.01); *G11C 29/1201* (2013.01)
(58) Field of Classification Search
CPC ...................................................... G11C 29/38

USPC .......................................................... 365/201
See application file for complete search history.

(56) References Cited

U.S. PATENT DOCUMENTS

| | | | | |
|---|---|---|---|---|
| 2012/0124273 A1* | 5/2012 | Goss | .................... | G11C 16/349 |
| | | | | 711/E12.001 |
| 2021/0004073 A1* | 1/2021 | Shah | ...................... | G06F 1/3212 |
| 2022/0027077 A1* | 1/2022 | Lang | ...................... | G06F 3/0659 |

* cited by examiner

*Primary Examiner* — Muna A Techane
(74) *Attorney, Agent, or Firm* — Patterson + Sheridan, LLP

(57) ABSTRACT

Examples herein describe memory lifecycle state sensors. A memory lifecycle state sensor includes a memory and a processor. The processor is configured to write a first value to a cell of the memory at a first voltage, and the cell is storing a second value written to the cell at a second voltage that is greater than the first voltage. A value is read from the cell and compared with the first value. An indication of a lifecycle state for the cell is generated based on comparing the value with the first value, the first voltage, and the second voltage.

19 Claims, 6 Drawing Sheets

500

506

502

504 504 504

504 504

504 504

504 504 504

504 504

504 504

504 504 504

600

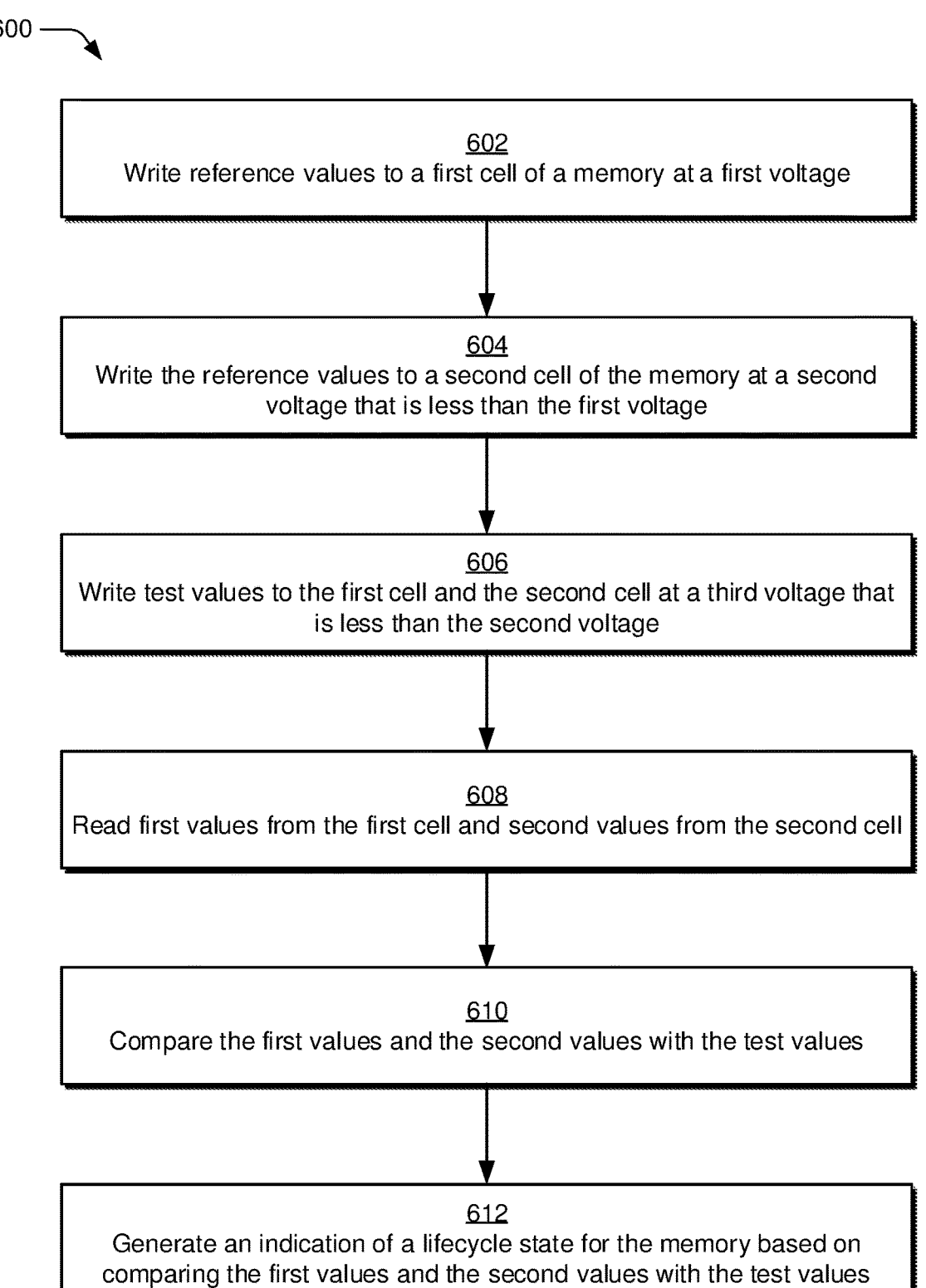

602
Write reference values to a first cell of a memory at a first voltage

604
Write the reference values to a second cell of the memory at a second voltage that is less than the first voltage

606
Write test values to the first cell and the second cell at a third voltage that is less than the second voltage

608
Read first values from the first cell and second values from the second cell

610
Compare the first values and the second values with the test values

612
Generate an indication of a lifecycle state for the memory based on comparing the first values and the second values with the test values

FIG. 6

MEMORY LIFECYCLE STATE SENSORS

TECHNICAL FIELD

Examples of the present disclosure generally relate to memory lifecycle states, and more specifically, to memory lifecycle state sensors.

BACKGROUND

Memory aging refers to a gradual degradation of physical and electrical properties of a memory after the memory has been written too many times over its lifecycle. As the physical and electrical properties of the memory gradually degrade, more current is needed in order to write to the memory (e.g., in order to overwrite patterns of values previously written to the memory). Continued use of aged memory is undesirable due to its decreasing reliability and the additional current consumption is inefficient.

SUMMARY

Memory lifecycle state sensors are described in some embodiments. In one or more embodiments, a memory lifecycle state sensor includes a memory and at least one processor. The at least one processor is configured to write a first value to a cell of the memory at a first voltage. In various embodiments, the cell is storing a second value written to the cell at a second voltage that is greater than the first voltage. In some embodiments, the at least one processor is configured to read a value from the cell and compare the value with the first value. In certain embodiments, an indication of a lifecycle state for the cell is generated based on comparing the value with the first value, the first voltage, and the second voltage.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 6 is a flow diagram depicting a method for generating an indication of a lifecycle state for a memory, according to some embodiments.

DETAILED DESCRIPTION

Figure 1:
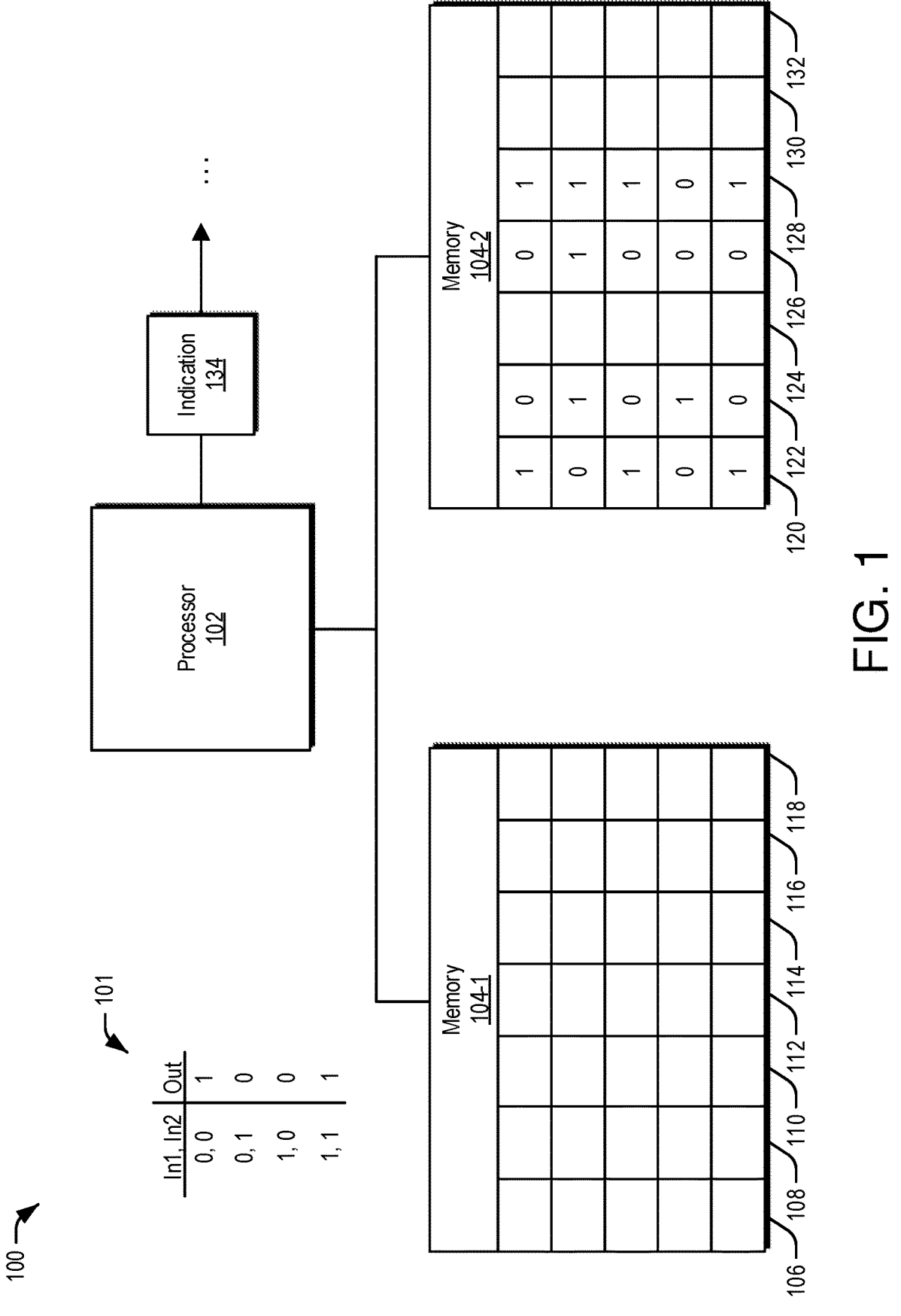
FIG. 1 illustrates an example memory lifecycle state sensor, according to some embodiments.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Memory aging is the gradual degradation of physical and electrical properties of memory which occurs after writing to the memory many times over the memory's lifecycle. Compared to memory that is not aged, aged memory requires more current in order to successfully write values to the memory (e.g., in order to overwrite patterns of values previously written to the memory). As a result, aged memory is unreliable and continued use of the aged memory is inefficient.

Examples herein describe memory lifecycle state sensors which include a memory and a processor. In some embodiments, the processor executes instructions which cause the processor to write reference values to a cell of the memory at a first voltage that is greater than a normal operating voltage for writing values to the memory. In one or more examples, the processor reads the reference values from the cell of the memory to ensure that the reference values are successfully written to the memory and stored in the cell.

In certain embodiments, instructions executed by the processor cause the processor to write test values to the cell of the memory at a second voltage that is less than the first voltage. In some examples, the test values are different from the corresponding reference values and the second voltage may be the normal operating voltage for writing values to the memory. In various embodiments, the processor executes instructions that cause the processor to read values from the cell of the memory and compare the values read from the cell of the memory with the test values.

If a value included in the values read from the cell of the memory does not match the corresponding test value, then the second voltage is not sufficient to write the corresponding test value over a value included in the reference values stored in the cell of the memory. The memory is likely aged memory since the first voltage is sufficient to write the value included in the reference values to the cell. In some embodiments, the processor executes instructions which cause the processor to generate an indication of a lifecycle state for the memory as "end of useful life." The described systems and techniques are capable of identifying/detecting the aged memory whether the aged memory has been written to normal number of times over a relatively long period of time or whether the aged memory has been written to a high number of times over a relatively short period of time.

FIG. 1 illustrates an example memory lifecycle state sensor 100, according to some embodiments. The memory lifecycle state sensor 100 is illustrated to include a processor 102, a memory 104-1, and a memory 104-2. In one or more embodiments, the processor 102 is representative of a variety of types of processors such as central processing units (CPUs), graphics processing units (GPUs), processors implemented using field-programmable gate arrays (FPGAs) (e.g., a soft processors), accelerators, etc.

In some embodiments, the memory 104-1 is a volatile memory. However, in other embodiments, the memory 104-1 may be a non-volatile memory. In various embodiments, the memory 104-1 is representative of random access memory (RAM), static RAM (SRAM), dynamic RAM (DRAM), custom RAM (CRAM), etc. The memory 104-1 is illustrated to include cells 106, 108, 110, 112, 114, 116, 118. In some examples, the memory 104-1 may be aged such that physical and electrical properties of the memory 104-1 have gradually degraded after writing many values to some or all of the cells 106, 108, 110, 112, 114, 116, 118.

In the example illustrated in FIG. 1, the memory 104-2 includes cells 120, 122, 124, 126, 128, 130, 132. In some embodiments, the memory 104-2 is an additional memory to the memory 104-1 (e.g., the memory 104-1 is RAM and the memory 104-2 is additional RAM). In other embodiments, the memory 104-2 is a known non-aged portion of the memory 104-1. In certain embodiments, the cell 120 stores reference values 1, 0, 1, 0, 1, and the cell 122 stores test values 0, 1, 0, 1, 0. In some examples, each of the reference values 1, 0, 1, 0, 1 is different from a corresponding one of the test values 0, 1, 0, 1, 0. In other examples, the test values may be 0, 0, 0, 0, 0. In one or more embodiments, in order to identify/determine a lifecycle state for the memory 104-1 (e.g., within useful life, nearing end of useful life, end of useful life, etc.), the processor 102 executes instructions that cause the processor 102 to write the reference values 1, 0, 1, 0, 1 to the cell 106 (or another one of the cells 108, 110, 112, 114, 116, 118) at a first voltage. In some examples, the first voltage is greater than a normal operating voltage for writing values to the memory 104-1.

After writing the reference values 1, 0, 1, 0, 1 to the cell 106 at the first voltage, the processor 102 may execute instructions which cause the processor 102 to read the reference values 1, 0, 1, 0, 1 from the cell 106, for example, to confirm that the reference values 1, 0, 1, 0, 1 were successfully written to the cell 106. In certain embodiments, the processor 102 executes instructions which cause the processor 102 to write the test values 0, 1, 0, 1, 0 to the cell 106 (e.g., to overwrite the reference values 1, 0, 1, 0, 1) at a second voltage. In some embodiments, the second voltage is less than the first voltage. In one or more examples, the second voltage can be the normal operating voltage for writing values to the memory 104-1.

In various embodiments, after writing the test values 0, 1, 0, 1, 0 to the cell 106 at the second voltage, the processor 102 executes instructions which cause the processor 102 to read values from the cell 106. In the illustrated example, the processor 102 writes the values read from the cell 106 of the memory 104-1 to the cell 126 of the memory 104-2. In some embodiments, the processor 102 executes instructions that cause the processor 102 to compare the test values 0, 1, 0, 1, 0 with the values read from the cell 106 (which are stored in the cell 126) such as by using a logical XNOR. The logical XNOR outputs a "1" if two inputs are the same and outputs a "0" if the two inputs are not the same. A truth table 101 for the logical XNOR is illustrated in FIG. 1. As shown, for a pair of inputs 11, 12 having values of 0, 0, respectively, the logical XNOR outputs a value of 1. For instance, if the pair of inputs 11, 12 have values of 0, 1, respectively, then the logical XNOR outputs a value of 0. Similarly, if the pair of inputs 11, 12 have values of 1, 0, respectively, then the logical XNOR outputs a value of 0. Finally, if the pair of inputs 11, 12 have values of 1, 1, respectively, then the logical XNOR outputs a value of 1. Accordingly, if one of the test values 0, 1, 0, 1, 0 does match a corresponding value stored in the cell 126, then the logical XNOR outputs "1." Conversely, if one of the test values 0, 1, 0, 1, 0 does not match a corresponding value stored in the cell 126, then the logical XNOR outputs "0." In the example illustrated in FIG. 1, the processor 102 writes the outputs from the logical XNOR to the cell 128.

For example, a first value in the cell 128 is 1 based on inputs of 0, 0; a second value in the cell 128 is 1 based on inputs of 1, 1; a third value in the cell 128 is 1 based on inputs of 0, 0; a fourth value in the cell 128 is 0 based on inputs of 1, 0; and a fifth value in the cell 128 is 1 based on inputs of 0, 0. Since the fourth value in the cell 128 is 0, writing the test values 0, 1, 0, 1, 0 to the cell 106 at the second voltage failed to overwrite one of the reference values 1, 0, 1, 0, 1 that were written to the cell 106 at the first voltage. Accordingly, in this example, a higher voltage than the second voltage is needed to reliably write values to the cell 128 which indicates that the memory 104-1 is aged. In various examples, since the memory 104-1 is aged, the processor 102 executes instructions that cause the processor to generate an indication 134 of the lifecycle state for the memory 104-1 as "end of useful life." For example, the processor 102 generates the indication 134 of the lifecycle state for the memory 104-1 in response to identifying/determining that the memory 104-1 is aged. In one or more examples, the indication 134 of the lifecycle state for the memory 104-1 is generated for display in a user interface, for addition to a memory aging log, for communication to a technician in order to replace the memory 104-1, etc.

In an alternative example in which the values read from the cell 106 and written to the cell 126 each match corresponding ones of the test values 0, 1, 0, 1, 0, the processor 102 executes instructions to write the reference values 1, 0, 1, 0, 1 to the cell 106 for future aging detection. In some embodiments, the processor 102 may be configured to execute instructions that cause the processor 102 to perform the aging detection in iterations in which the processor 102 writes the reference values 1, 0, 1, 0, 1 to the cell 106 at the first voltage, decreases a value of the second voltage, writes the test values 0, 1, 0, 1, 0 to the cell 106 at the second voltage with the decreased value, reads values from the cell 106, and compares the values read from the cell 106 with the test values 0, 1, 0, 1, 0. In these embodiments, if the values read from the cell 106 each match corresponding ones of the test values 0, 1, 0, 1, 0, then the processor 102 executes instructions which cause the processor 102 to perform another iteration of the aging detection using a further decreased value of the second voltage. For example, the processor 102 continues to decrease the value of the second voltage and perform iterations of aging detection until writing the test values 0, 1, 0, 1, 0 to the cell 106 at a particular value of the second voltage fails to overwrite one or more of the reference values 1, 0, 1, 0, 1. In this example, the processor 102 generates the indication 134 of the lifecycle state for the memory 104-1 based on the particular value of the second voltage (e.g., and the first voltage).

Although the memory lifecycle state sensor 100 is illustrated to include the memory 104-2 which can be representative of known non-aged memory, in some examples, functionality described with respect to the memory 104-2 is included in the memory 104-1. In certain examples, if the processor 102 executes instructions which cause the processor 102 to perform aging detection relative to the cell 106, it may be preferable for the processor 102 to write values read from the cell 106 (for comparison with the test values 0, 1, 0, 1, 0) to the cell 118 rather than the cell 108. For example, because of the close proximity of the cells 106, 108, an amount of gradual degradation of physical and electrical properties of the cell 108 is likely similar to an amount of gradual degradation of physical and electrical properties of the cell 106.

Figure 2:
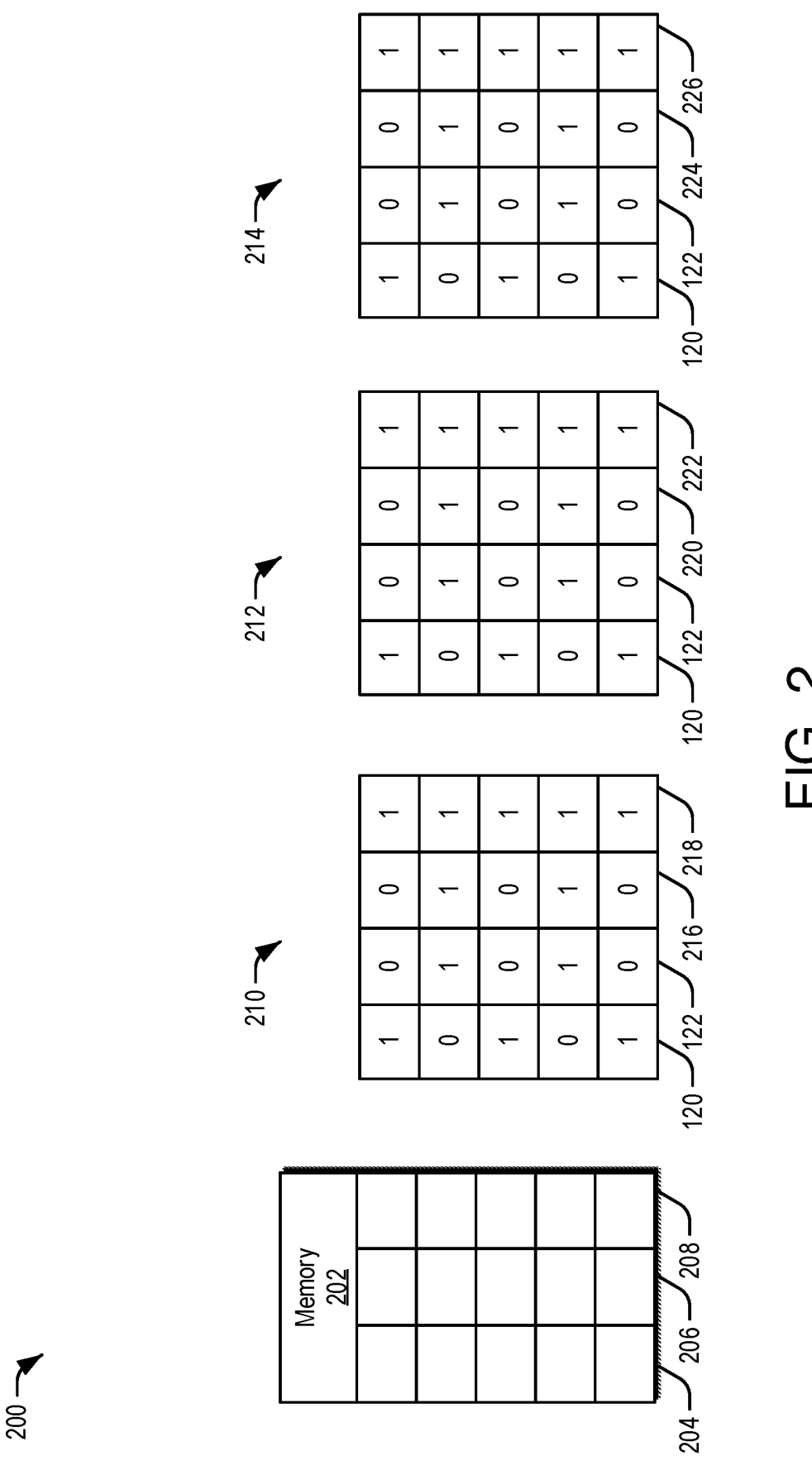
FIG. 2 illustrates a first example of memory lifecycle state sensors writing reference values at different voltages, according to some embodiments.

FIG. 2 illustrates a first example 200 of memory lifecycle state sensors writing reference values at different voltages, according to some embodiments. The first example 200 includes a memory 202 which may be representative of the memory 104-1 or a different memory. The memory 202 is illustrated to include cells 204, 206, 208, and the processor 102 executes instructions which cause the processor 102 to write the reference values 1, 0, 1, 0, 1 to the memory 202 at a high voltage 210, a medium voltage 212, and a low voltage 214 in order to identify/determine a lifecycle state for the memory 202. For example, the high voltage 210 is greater than the medium voltage 212 which is greater than the low voltage 214.

In one or more embodiments, the processor 102 writes the reference values 1, 0, 1, 0, 1 to the cell 204 of the memory 202 at the high voltage 210. In some examples, the processor 102 executes instructions which cause the processor 102 to read the reference values 1, 0, 1, 0, 1 from the cell 204 to confirm that the reference values 1, 0, 1, 0, 1 are stored in the cell 204. The processor 102 then executes instructions which cause the processor 102 to write the test values 0, 1, 0, 1, 0 to the cell 204 at a normal operating voltage for writing values to the memory 202. In certain embodiments, the high voltage 210 is greater than the normal operating voltage for writing values to the memory 202. In some embodiments, after writing the test values 0, 1, 0, 1, 0 to the cell 204, the processor 102 reads values from the cell 204 and writes the values read from the cell 204 to cell 216 for comparison with the test values 0, 1, 0, 1, 0. In various examples, the processor 102 executes instructions which cause the processor 102 to compare the test values 0, 1, 0, 1, 0 with corresponding values written to the cell 216 using the logical XNOR. For example, the processor 102 writes the outputs from the logical XNOR to cell 218. As shown in FIG. 2, each value in the cell 218 is 1 which indicates that the values read from the cell 204 match the corresponding test values 0, 1,0, 1, 0.

In certain embodiments, the processor 102 executes instructions that cause the processor 102 to write the reference values 1, 0, 1, 0, 1 to the cell 206 of the memory 202 at the medium voltage 212. In one or more examples, the processor 102 may read the reference values 1, 0, 1, 0, 1 from the cell 206 to confirm that the reference values 1, 0, 1, 0, 1 are stored in the cell 206. After writing the reference values 1, 0, 1, 0, 1 to the cell 206, the processor 102 writes the test values 0, 1, 0, 1, 0 to the cell 206 at the normal operating voltage for writing values to the memory 202. In some embodiments, the medium voltage 212 is greater than the normal operating voltage for writing values to the memory 202. In other embodiments, the medium voltage 212 is less than or equal to the normal operating voltage for writing values to the memory 202.

In various embodiments, after writing the test values 0, 1, 0, 1, 0 to the cell 206, the processor 102 executes instructions which cause the processor to read values from the cell 206, and write the values read from the cell 206 to cell 220. For example, the processor 102 compares the test values 0, 1, 0, 1, 0 and corresponding values written to the cell 220 as using the logical XNOR, and the processor 102 writes outputs from the logical XNOR to cell 222. Like the cell 218, each value in the cell 222 is 1 which indicates that the values read from the cell 206 match the corresponding test values 0, 1, 0, 1, 0.

In some embodiments, the processor 102 executes instructions which cause the processor 102 to write the reference values 1, 0, 1, 0, 1 to the cell 208 of the memory 202 at the low voltage 214. For example, the processor 102 may execute instructions which cause the processor 102 to read the reference values 1, 0, 1, 0, 1 from the cell 208 in order to confirm that the reference values 1, 0, 1, 0, 1 are stored in the cell 208. In one or more examples, after writing the reference values 1, 0, 1, 0, 1 to the cell 208, the processor 102 writes the test values 0, 1, 0, 1, 0 to the cell 208 at the normal operating voltage for writing values to the memory 202. In some embodiments, the low voltage 214 is greater than the normal operating voltage for writing values to the memory 202. In other embodiments, the low voltage 214 is less than or equal to the normal operating voltage for writing values to the memory 202.

In certain embodiments, after writing the test values 0, 1, 0, 1, 0 to the cell 208, the processor 102 executes instructions that cause the processor 102 to read values from the cell 208. For example, the processor 102 writes the values read from the cell 208 to cell 224 for comparison with the test values 0, 1, 0, 1, 0 using the logical XNOR. In various examples, the processor 102 executes instructions that cause the processor 102 to compare the test values 0, 1, 0, 1, 0 and corresponding values written to the cell 224 using the logical XNOR, and then write outputs from the logical XNOR to cell 226. Like the cells 218, 222 each value in the cell 226 is 1 which indicates that the values read from the cell 208 match the corresponding test values 0, 1, 0, 1, 0.

Since the test values 0, 1, 0, 1, 0 are successfully written over the reference values 1, 0, 1, 0, 1 when these values were written at each of the high voltage 210, the medium voltage 212, and the low voltage 214, the processor 102 executes instructions to identify/determine a lifecycle state for the memory 202 as "within useful life." For example, the processor 102 executes instructions that cause the processor 102 to generate the indication 134 of the lifecycle state for the memory 202 as "within useful life." In various embodiments, the processor 102 then writes the reference values 1, 0, 1, 0, 1 to the cell 204 at the high voltage 210, to the cell 206 at the medium voltage 212, and to the cell 208 at the low voltage 214 for future aging detection.

Figure 3:
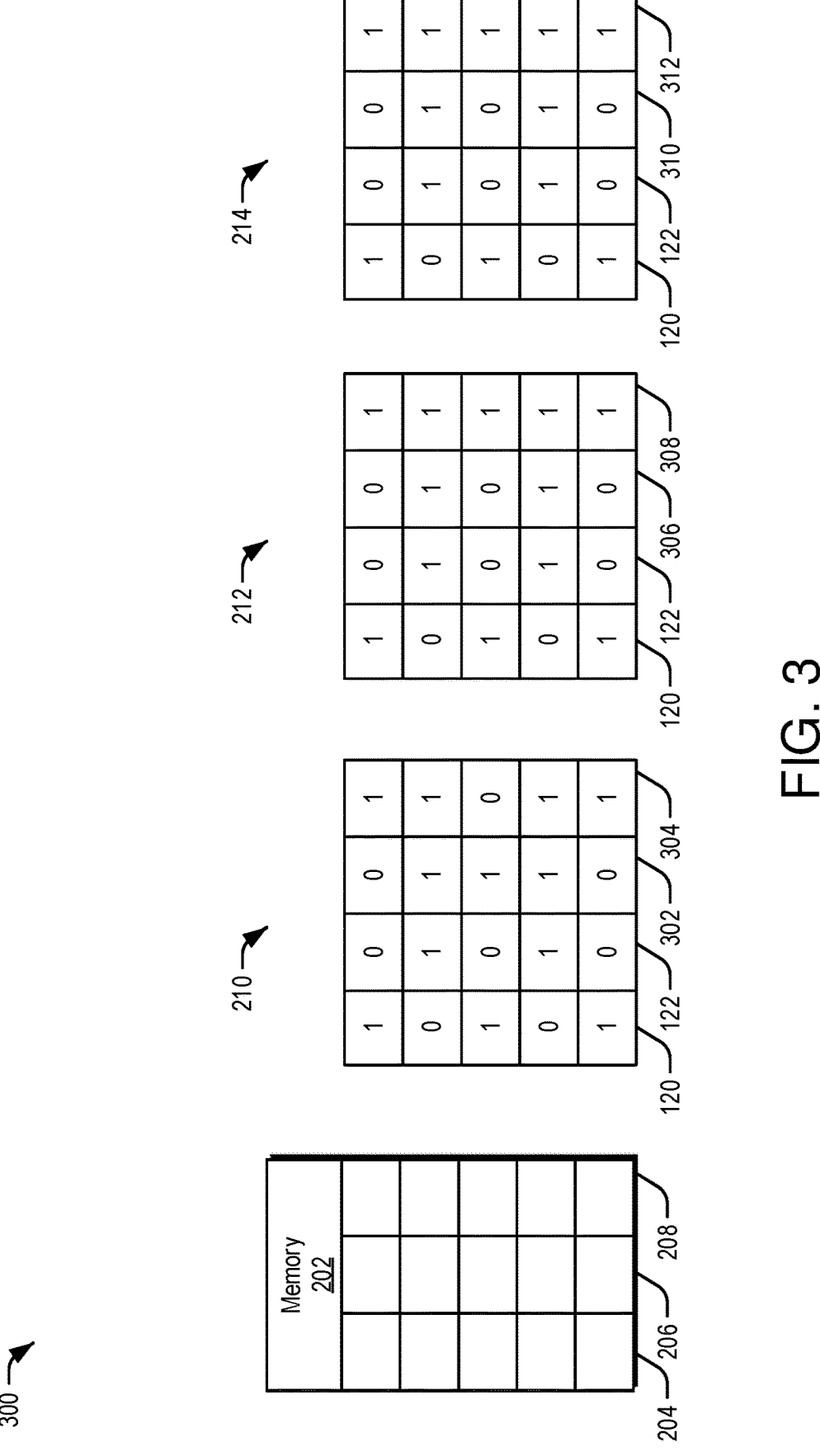
FIG. 3 illustrates a second example of memory lifecycle state sensors writing reference values at different voltages, according to some embodiments.

FIG. 3 illustrates a second example 300 of memory lifecycle state sensors writing reference values at different voltages, according to some embodiments. The second example 300 includes the memory 202. In some embodiments, the processor 102 executes instructions which cause the processor 102 to write the reference values 1, 0, 1, 0, 1 to the cell 204 at the high voltage 210, write the reference values 1, 0, 1, 0, 1 to the cell 206 at the medium voltage 212, and write the reference values 1, 0, 1, 0, 1 to the cell 208 the low voltage 214 in order to identify/determine a lifecycle state for the memory 202 in a same manner as described with respect to FIG. 2. In various embodiments, the processor 102 writes the test values 0, 1, 0, 1, 0 to the cells 204, 206, 208 at the normal operating voltage for writing values to the memory 202.

In one or more embodiments, the processor 102 reads values from the cell 204 and writes the values read from the cell 204 to cell 302. In some examples, the processor 102 executes instructions that cause the processor 102 to compare the test values 0, 1, 0, 1, 0 with corresponding values written to the cell 302 using the logical XNOR. In these examples, the instructions executed by the processor 102 cause the processor 102 to write outputs from the logical XNOR to cell 304. As shown in FIG. 3, a first value in the cell 304 is 1 based on inputs of 0, 0; a second value in the cell 304 is 1 based on inputs of 1, 1; a third value in the cell 304 is 0 based on inputs of 0, 1; a fourth value in the cell 304 is 1 based on inputs of 1, 1; and a fifth value in the cell 304 is 1 based on inputs of 0, 0. Because the third value in the cell 304 is 0, writing the test values 0, 1, 0, 1, 0 to the cell 204 did not overwrite all of the reference values 1, 0, 1, 0, 1 stored in the cell 204 which indicates that the memory 202 is aged.

In some embodiments, the processor 102 executes instructions that cause the processor 102 to read values from the cell 206 and write the values read from the cell 206 to cell 306. For example, the processor 102 executes instructions that cause the processor 102 to compare the test values 0, 1, 0, 1, 0 with corresponding values written to the cell 306 using the logical XNOR. The instructions executed by the processor 102 cause the processor 102 to write outputs from the logical XNOR to cell 308. In the illustrated example, each of value in the cell 308 is 1 which indicates that the memory 202 is not aged.

In various embodiments, the processor 102 executes instructions that cause the processor 102 to read values from the cell 208 and write the values read from the cell 208 to cell 310. In some examples, the processor 102 executes instructions that cause the processor 102 to compare the test values 0, 1, 0, 1, 0 with corresponding values written to the cell 310 using the logical XNOR. For example, the instructions executed by the processor 102 cause the processor 102 to write outputs from the logical XNOR to cell 312. As shown in FIG. 3, each of value in the cell 312 is 1 which indicates that the memory 202 is not aged.

In certain embodiments, writing the test values 0, 1, 0, 1, 0 to the memory 202 at the normal operating voltage for writing values to the memory 202 failed to overwrite one of the reference values 1, 0, 1, 0, 1 when the reference values 1, 0, 1, 0, 1 were written to the memory 202 at the high voltage 210, but successfully overwrote each of the reference values 1, 0, 1, 0, 1 when the reference values 1, 0, 1, 0, 1 were written to the memory 202 at the medium voltage 212 and the low voltage 214. In an example in which the high voltage 210 is greater than the normal operating voltage for writing values to the memory 202, the processor 102 executes instructions that cause the processor 102 to generate the indication 134 of the lifecycle state for the memory 202 as "nearing end of useful life." In some embodiments, the processor 102 then writes the reference values 1, 0, 1, 0, 1 to the cell 204 at the high voltage 210, to the cell 206 at the medium voltage 212, and to the cell 208 at the low voltage 214 for future aging detection.

Figure 4:
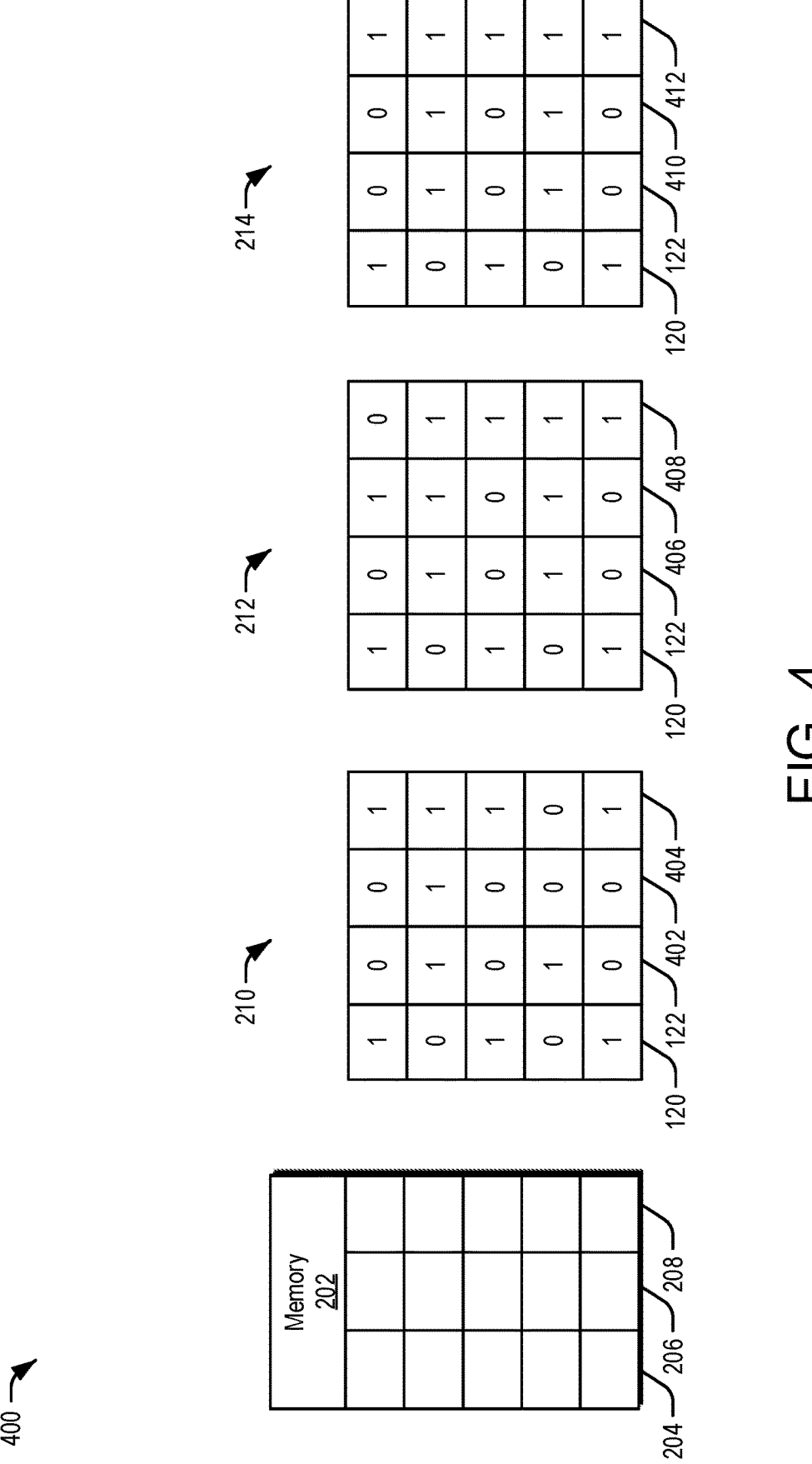
FIG. 4 illustrates a third example of memory lifecycle state sensors writing reference values at different voltages, according to some embodiments.

FIG. 4 illustrates a third example 400 of memory lifecycle state sensors writing reference values at different voltages, according to some embodiments. As shown, the third example 400 includes the memory 202. In one or more embodiments, the processor 102 executes instructions which cause the processor 102 to write the reference values 1, 0, 1, 0, 1 to the cell 204 at the high voltage 210, write the reference values 1, 0, 1, 0, 1 to the cell 206 at the medium voltage 212, and write the reference values 1, 0, 1, 0, 1 to the cell 208 the low voltage 214 in order to identify/determine a lifecycle state for the memory 202 in a same manner as described with respect to FIG. 2. In some embodiments, the processor 102 executes instructions that cause the processor 102 to write the test values 0, 1, 0, 1, 0 to the cells 204, 206, 208 at the normal operating voltage for writing values to the memory 202.

In certain embodiments, the processor 102 executes instructions which cause the processor 102 to read values from the cell 204 and write the values read from the cell 204 to cell 402. In some examples, the processor 102 executes instructions that cause the processor 102 to compare the test values 0, 1, 0, 1, 0 with corresponding values written to the cell 402 using the logical XNOR. In these examples, the instructions executed by the processor 102 cause the processor 102 to write outputs from the logical XNOR to cell 404. In the illustrated example, a first value in the cell 404 is 1 based on inputs of 0, 0; a second value in the cell 404 is 1 based on inputs of 1, 1; a third value in the cell 404 is 1 based on inputs of 0, 0; a fourth value in the cell 404 is 0 based on inputs of 1, 0; and a fifth value in the cell 404 is 1 based on inputs of 0, 0. Since the fourth value in the cell 404 is 0, writing the test values 0, 1, 0, 1, 0 to the cell 204 did not overwrite all of the reference values 1, 0, 1, 0, 1 stored in the cell 204. In various examples, failing to overwrite each of the reference values 1, 0, 1, 0, 1 indicates that the memory 202 is aged.

In some embodiments, the processor 102 executes instructions that cause the processor 102 to read values from the cell 206 and write the values read from the cell 206 to cell 406. In one or more embodiments, the processor 102 executes instructions that cause the processor 102 to compare the test values 0, 1, 0, 1, 0 with corresponding values written to the cell 406 using the logical XNOR. For example, the instructions executed by the processor 102 cause the processor 102 to write outputs from the logical XNOR to cell 408. As shown in FIG. 4, a first value in the cell 408 is 0 based on inputs of 0, 1; a second value in the cell 408 is 1 based on inputs of 1, 1; a third value in the cell 408 is 1 based on inputs of 0, 0; a fourth value in the cell 408 is 1 based on inputs of 1, 1; and a fifth value in the cell 408 is 1 based on inputs of 0, 0. Because the first value in the cell 408 is 0, writing the first test value 0 to the cell 406 failed to overwrite the first reference value 1 stored in the cell 408 which indicates that the memory 202 is aged.

In various embodiments, the processor 102 executes instructions that cause the processor 102 to read values from the cell 208 and write the values read from the cell 208 to cell 410. In one or more embodiments, the processor 102 executes instructions that cause the processor 102 to compare the test values 0, 1, 0, 1, 0 with corresponding values written to the cell 410 using the logical XNOR. In some examples, the instructions executed by the processor 102 cause the processor 102 to write outputs from the logical XNOR to cell 412. As shown in FIG. 4, each of value in the cell 412 is 1 which indicates that the memory 202 is not aged.

In one or more embodiments, although the test values 0, 1, 0, 1, 0 successfully overwrote each of the reference values 1, 0, 1, 0, 1 written to the memory 202 at the low voltage 214, the test values 0, 1, 0, 1, 0 failed to overwrite the reference values 1, 0, 1, 0, 1 written to the memory 202 at the high voltage 210 and at the medium voltage 212. In these embodiments, the processor 102 executes instructions that cause the processor 102 to generate the indication 134 of the lifecycle state for the memory 202 as "end of useful life." In some embodiments, the processor 102 may not write the reference values 1, 0, 1, 0, 1 to the cells 204, 206, 208 for future aging detection based on the indication 134 of the lifecycle state for the memory 202 being "end of useful life."

Figure 5:
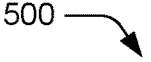
FIG. 5 illustrates an example distribution of memory lifecycle state sensors in a memory, according to some embodiments.

FIG. 5 illustrates an example distribution 500 of memory lifecycle state sensors in a memory, according to some embodiments. A memory 502 includes memory lifecycle state sensor circuitry having multiple memory lifecycle state sensors 504 arranged throughout the memory 502. As shown, the memory 502 is included in an integrated circuit (IC) die 506 (e.g., as a memory IC). For example, the memory 502 is representative of the memory 104-1 or a different memory. In some embodiments, the memory life-cycle state sensors 504 are included in portions of the memory 502 where aging can occur. If/when one of the portions of the memory 502 ages and degrades, then the aging is detected by one of the memory lifecycle state sensors 504.

FIG. 6 is a flow diagram depicting a method 600 for generating an indication of a lifecycle state for a memory, according to some embodiments. At 602, reference values are written to a first cell of a memory at a first voltage. In various embodiments, the processor 102 executes instructions which cause the processor 102 to write the reference values to the cell 106 of the memory 104-1 at the high voltage 210. At 604, the reference values are written to a second cell of the memory at a second voltage that is less than the first voltage. In some embodiments, the processor 102 executes instructions that cause the processor 102 to write the reference values to the cell 108 of the memory 104-1 at the medium voltage 212.

At 606, test values are written to the first cell and the second cell at a third voltage that is less than the second voltage. In certain embodiments, the processor 102 executes instructions that cause the processor 102 to write the test values to the cell 106 and the cell 108 at the low voltage 214. At 608, first values are read from the first cell and second values are read from the second cell. In one or more embodiments, instructions executed by the processor 102 cause the processor 102 to read the first values from the cell 106 and read the second values from the cell 108.

At 610, the first values and the second values are com-pared with the test values. In some embodiments, the processor 102 executes instructions which cause the proces-sor 102 to compare the first values and the second values with the test values. At 612, an indication is generated of a lifecycle state for the memory based on comparing the first values and the second values with the test values. In various embodiments, instructions executed by the processor 102 cause the processor 102 to generate the indication 134 of the lifecycle state for the memory 104-1 based on comparing the first values and the second values with the test values.

In the preceding, reference is made to embodiments presented in this disclosure. However, the scope of the present disclosure is not limited to specific described embodiments. Instead, any combination of the described features and elements, whether related to different embodi-ments or not, is contemplated to implement and practice contemplated embodiments. Furthermore, although embodi-ments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

While the foregoing is directed to specific examples, other and further examples may be devised without departing from the basic scope thereof, and the scope thereof is determined by the claims that follow.

What is claimed is:
1. A memory lifecycle state sensor comprising:
a memory; and
at least one processor configured to:
    write a first value to a cell of the memory at a first voltage, the cell having previously stored a second value that was written to the cell at a second voltage that is greater than the first voltage;
    read a value stored in the cell after writing the first value from the cell;
    compare the read value with the first value; and
    generate an indication of a lifecycle state for the cell based on comparing the read value with the first value, and based on a relationship between the first voltage used to write the first value and the second voltage used to write the second value.

2. The memory lifecycle state sensor of claim 1, wherein the at least one processor is further configured to write the second value to the cell in response to the value matching the first value.

3. The memory lifecycle state sensor of claim 1, wherein the first value is different from the second value.

4. The memory lifecycle state sensor of claim 1, wherein the value is compared with the first value using cells of an additional memory.

5. The memory lifecycle state sensor of claim 1, wherein the at least one processor is further configured to read the second value from the cell after the second value was written at the second voltage.

6. The memory lifecycle state sensor of claim 1, wherein the at least one processor is further configured to:
    write the first value to an additional cell of the memory at the first voltage, the additional cell having previously stored the second value written to the additional cell at a third voltage;
    read an additional value from the additional cell; and
    compare the additional value with the first value.

7. The memory lifecycle state sensor of claim 6, wherein the third voltage is greater than the second voltage.

8. The memory lifecycle state sensor of claim 6, wherein the third voltage is less than the second voltage and greater than the first voltage.

9. The memory lifecycle state sensor of claim 1, wherein the memory includes random access memory (RAM).

10. The memory lifecycle state sensor of claim 1, wherein the lifecycle state is at least one of within useful life, nearing end of useful life, or end of useful life.

11. The memory lifecycle state sensor of claim 1, wherein the second value is written to the cell two or more times.

12. A memory integrated circuit (IC) comprising:
a memory; and
a memory lifecycle state sensor of the memory configured to:
    write reference values comprising a multi-bit pattern to a cell of the memory at a first voltage, the cell having previously stored second values written at a second voltage greater than the first voltage;
    read the values stored in the cell after writing the reference values from the cell;
    write test values comprising a multi-bit pattern to the cell at a third voltage that is less than the first voltage;
    read test read-back values from the cell after writing the test values;
    compare the test read-back values with the test values; and
    generate an indication of a lifecycle state for the cell based on comparing the test read-back values with the test values, and based on a relationship between the first, second, and third voltages used to write the respective values.

13. The memory IC of claim 12, wherein the reference values and corresponding values of the test values are different.

14. The memory IC of claim 12, wherein the test read-back values are compared with the test values using cells of an additional memory.

15. The memory IC of claim 12, wherein the memory lifecycle state sensor is further configured to write the reference values to the cell in response to the test read-back values matching the test values.

16. A method comprising:

writing, by at least one processor, reference values comprising a multi-bit pattern to a first cell of a memory at a first voltage;

writing, by the at least one processor, the reference values as a same multi-bit pattern to a second cell of the memory at a second voltage that is less than the first voltage;

writing, by the at least one processor, test values comprising a multi-bit pattern to the first cell and the second cell at a third voltage that is less than the second voltage;

reading, by the at least one processor, first read-back values from the first cell and second read-back values from the second cell after the test values are written;

comparing, by the at least one processor, the first read-back values and the second read-back values with the test values; and generating, by the at least one processor, an indication of a lifecycle state for the memory based on comparing the first read-back values and the second read-back values with the test values, and based on the first, second, and third voltages used to write respective values.

17. The method of claim 16, wherein a value of the second read-back values does not match a corresponding value of the test values and the lifecycle state is end of useful life.

18. The method of claim 16, wherein the second read-back values match corresponding values of the test values and a value of the first read-back values does not match a corresponding value of the test values and the lifecycle state is nearing end of useful life.

19. The method of claim 16, wherein the first read-back values match corresponding values of the test values and the second read-back values match the corresponding values of the test values and the lifecycle state is within useful life.

* * * * *